United States Patent
Sung et al.

(10) Patent No.: US 6,285,725 B1
(45) Date of Patent: Sep. 4, 2001

(54) CHARGE PUMP CIRCUIT

(75) Inventors: Jun Bae Sung; Byeong Yeol Kim, both of Ichon (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/195,664

(22) Filed: Nov. 18, 1998

(30) Foreign Application Priority Data

Nov. 21, 1997 (KR) .................................................. 97-62079

(51) Int. Cl.⁷ .................................................... H03L 7/095
(52) U.S. Cl. .......................... 375/374; 327/148; 327/157; 331/17
(58) Field of Search ........................... 375/374; 327/148, 327/157; 331/14, 17, 8

(56) References Cited

U.S. PATENT DOCUMENTS

| | | |
|---|---|---|
| 5,614,855 | 3/1997 | Lee et al. ............................. 327/158 |
| 5,642,082 | 6/1997 | Jefferson ............................... 331/25 |
| 5,661,419 | 8/1997 | Bhagwan ............................... 327/8 |
| 5,663,665 | 9/1997 | Wang et al. ........................... 327/3 |
| 5,670,869 | 9/1997 | Weisenbach ......................... 323/313 |
| 5,699,020 | 12/1997 | Jefferson ............................... 331/17 |
| 5,727,037 | 3/1998 | Maneatis ............................... 375/376 |
| 5,783,972 | * 7/1998 | Nishikawa ............................ 331/17 |
| 6,057,739 | * 5/2000 | Crowley et al. ...................... 331/14 |

* cited by examiner

*Primary Examiner*—Amanda T. Le
(74) *Attorney, Agent, or Firm*—Nath & Associates PLLC; Gary M. Nath; Marvin C. Berkowitz

(57) ABSTRACT

A charge pump circuit in a DLL device used as a clock compensation device is disclosed. A controller for controlling current value and a driver for driving the controller are added to the existing charge pump circuit. Thus, the charge pump circuit reduces lock time and the size of output jitter so that performance of the DLL device can be improved.

3 Claims, 3 Drawing Sheets

CHARGE PUMP CIRCUIT

BACKGROUND OF THE INVENTION

1. Field of the Invention

The present invention relates to a clock compensation circuit for use in synchronous DRAM (SDRAM) of high fast or RAMBUS DRAM which has received much attention recently, and more particularly, to a charge pump circuit in a delay locked loop (DLL) of a clock compensation circuit such as DLL and a phase locked loop (PLL) which outputs an inner clock by receiving an outer clock.

2. Discussion of the Related Art

A DLL device generates an inner clock by uniformly maintaining the frequency of a received outer clock and the frequency of the inner clock and controlling delay time. A PLL device generates an inner clock having different frequency from one another by converting the frequency of a received outer clock. The DLL device includes a phase detector, a charge pump circuit and a delay device. The phase detector detects phase difference between the frequency of the outer clock and the frequency of the inner clock. The charge pump circuit performs pumping operation by an output signal of the phase detector and controls a transistor of the delay device to adjust delay length of the entire cell. The delay device is controlled by the output signal of the charge pump circuit to generate the inner clock.

FIG. 1 shows a background art charge pump circuit of the DLL device. As shown in FIG. 1, the charge pump circuit includes a first PMOS transistor MP1 connected between a power source voltage terminal Vcc and a first node N1, whose gate receives a certain bias voltage pbias; a second PMOS transistor MP2 connected between the first node N1 and a third node N3, whose gate receives a phase detector output signal pmpup; a third PMOS transistor MP3 connected between the first node N1 and a second node N2, whose gate receives a phase detector output signal /pmpup; a first NMOS diode MN1 connected between the second node N2 and a fourth node N4, whose gate is connected to a pump output terminal /pmpout; a second NMOS transistor MN2 connected between the third node N3 and the fourth node N4, whose gate is connected to the pump output terminal /pmpout; a first capacitor C1 connected between the pump output terminal /pmpout and a ground voltage terminal Vss; a fourth NMOS diode MN4 connected between the third node N3 and the fourth node N4, whose gate is connected to the pump output terminal pmpout; a third NMOS transistor MN3 connected between the second node N2 and the fourth node N4, whose gate is connected to the pump output terminal pmpout; a second capacitor C2 connected between the pump output terminal pmpout and the ground voltage terminal Vss; a fifth NMOS transistor MN5 connected between the fourth node N4 and the ground voltage terminal Vss; a sixth NMOS transistors MN6 connected between the power source voltage terminal Vcc and the pump output terminal /pmpout, whose gate receives a DLL reset signal dll-reset; a seventh NMOS transistor MN7 connected between the power source voltage terminal Vcc and the pump output terminal pmpout, whose gate receives the DLL reset signal dll-reset; and an eighth NMOS transistor MN8 connected between the two pump output terminals, whose gate receives the DLL reset signal dll-reset.

The operation of the charge pump circuit will be described below.

The first PMOS transistor MP1 is turned on by certain bias voltage so that current flows to the first node. This current is transferred to the second node or the third node through the second PMOS transistor MP2 or the third PMOS transistor MP3 which is selectively turned on by the phase detector output signal, and is charged to the first capacitor or the second capacitor.

For example, if the phase detector output signal pmpup is low, the second PMOS transistor MP2 is turned on and the second capacitor is charged, so that the potential of the pump output terminal pmpout ascends. In this case, assuming that the inner clock gradually follows the outer clock, the phase of the inner clock becomes faster than the phase of the outer clock by controlling the delay device as the potential of the pump output terminal pmpout ascends.

Meanwhile, at the initial step for preparing to operate the charge pump, the two pump output terminals become high state since the charge pump is reset at the same level. Therefore, the potential of the pump output terminal pmpout depending on charge of the second capacitor ascends, so that the third NMOS transistor MN3 is turned on and the charge of the first capacitor at the high state is discharged to the ground voltage terminal through the third NMOS transistor MN3.

Meanwhile, if the phase detector output signal /pmpup is low, the first capacitor is charged while the second capacitor is discharged.

In other words, if the phase of the inner clock becomes faster than the phase of the outer clock, the phase detector in the DLL device changes pumping direction of the pump to allow the inner clock to be slower than the outer clock.

If the phase of the outer clock is again faster than the phase of the inner clock, the pumping direction i, again changed so that the inner clock follows the outer clock. This operation continues to repeat. As a result, lock state is achieved.

However, the background art charge pump circuit has the following problems.

In general, performance of the DLL device is determined by the correlation between lock time and output jitter. In other words, the performance of the DLL device can be improved by reducing lock time and the size of the output jitter. The lock time means time that takes until the phase of the inner clock is identical with the phase of the outer clock, and the output jitter means movement degree of the generated inner clock.

In the background of art charge pump circuit to make the lock time fast, charge/discharge amount per hour increases by increasing the turn-on size of the first PMOS transistor MP1 whose gate receives a certain bias voltage to flow a large amount of currents. Thus, the lock time can be reduced. However, in this case, although the lock time is reduced, a large amount of currents continues to flow after the lock and also the charge/discharge amount per hour continues to increase. This increases the size of the jitter, thereby deteriorating the performance of the DLL device.

Furthermore, since the background art charge pump circuit has no signal to indicates the lock, there exists inconvenience in interfacing with the external environment.

SUMMARY OF THE INVENTION

Accordingly, the present invention is directed to a charge pump circuit that substantially obviates one or more of the problems due to the limitations and disadvantages of the related art.

An object of the present invention is to provide a charge pump circuit which reduces lock time and the size of jitter by increasing current value before lock and reducing current value after lock, so as to improve performance of a DLL device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a charge pump circuit according to the present invention includes a lock time/jitter control means connected to a power source supply terminal and a ground terminal of the charge pump circuit, for controlling current value to allow large current value to be transferred before lock and allow small current value to be transferred after lock, and a lock time/jitter driving means for driving the lock time/jitter control means, wherein the lock time/jitter control means includes MOS transistors and the lock time/jitter control means includes a counter for receiving a phase detector output signal and a charge pump reset signal to prevent the phase detector output signal from becoming unstable, and a lock time/jitter control signal generating means for outputting a control signal of the lock time/jitter control means from an output of the counter and a power source voltage. The counter includes a plurality of D flip-flops and the lock time/jitter control signal generating means which includes a D flip-flop. A lock signal generating terminal can be added to an output terminal of the lock time/jitter driving means.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
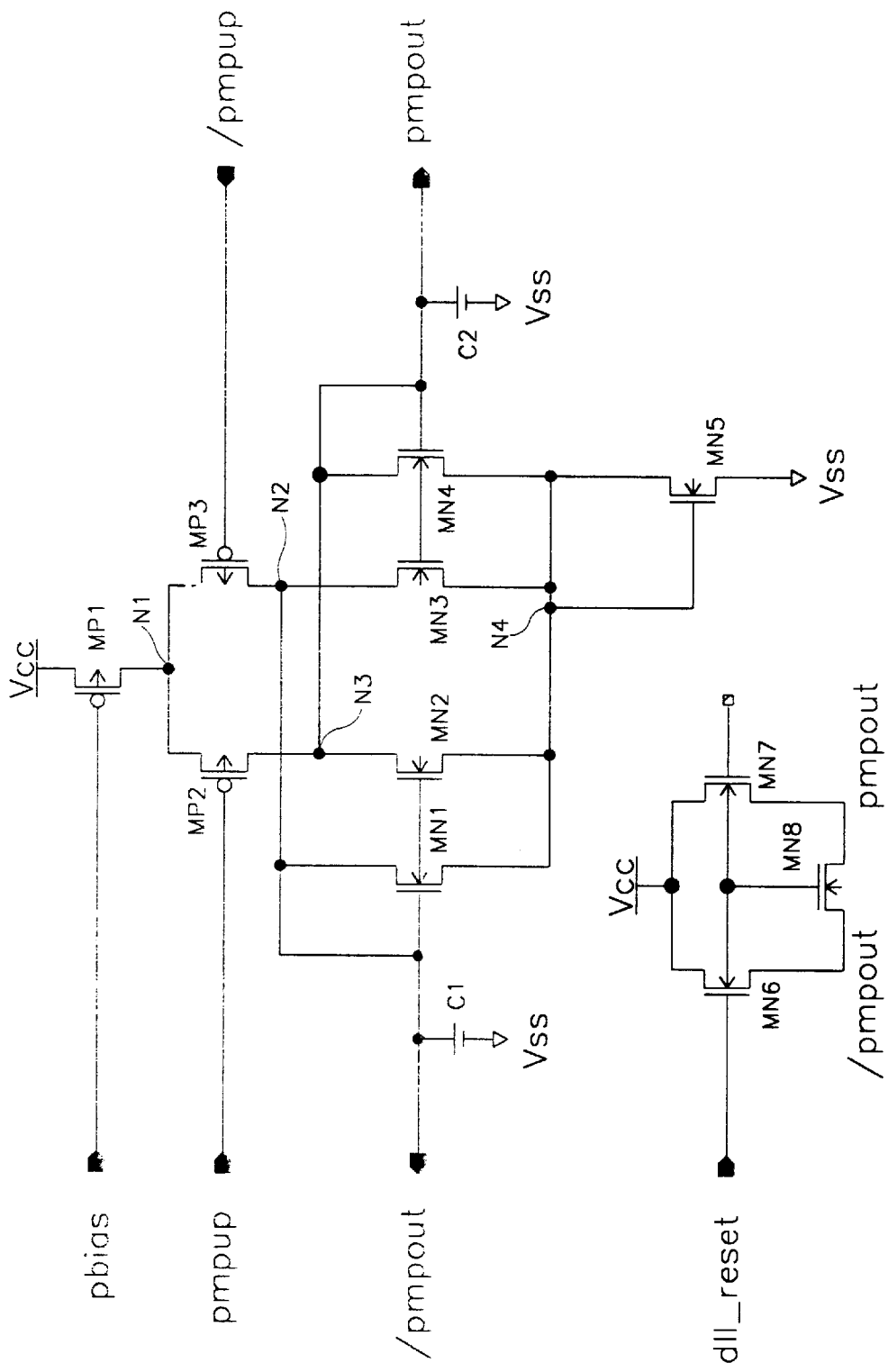
FIG. 1 is a circuit diagram illustrating a background art charge pump circuit in a DLL device.
Figure 2:
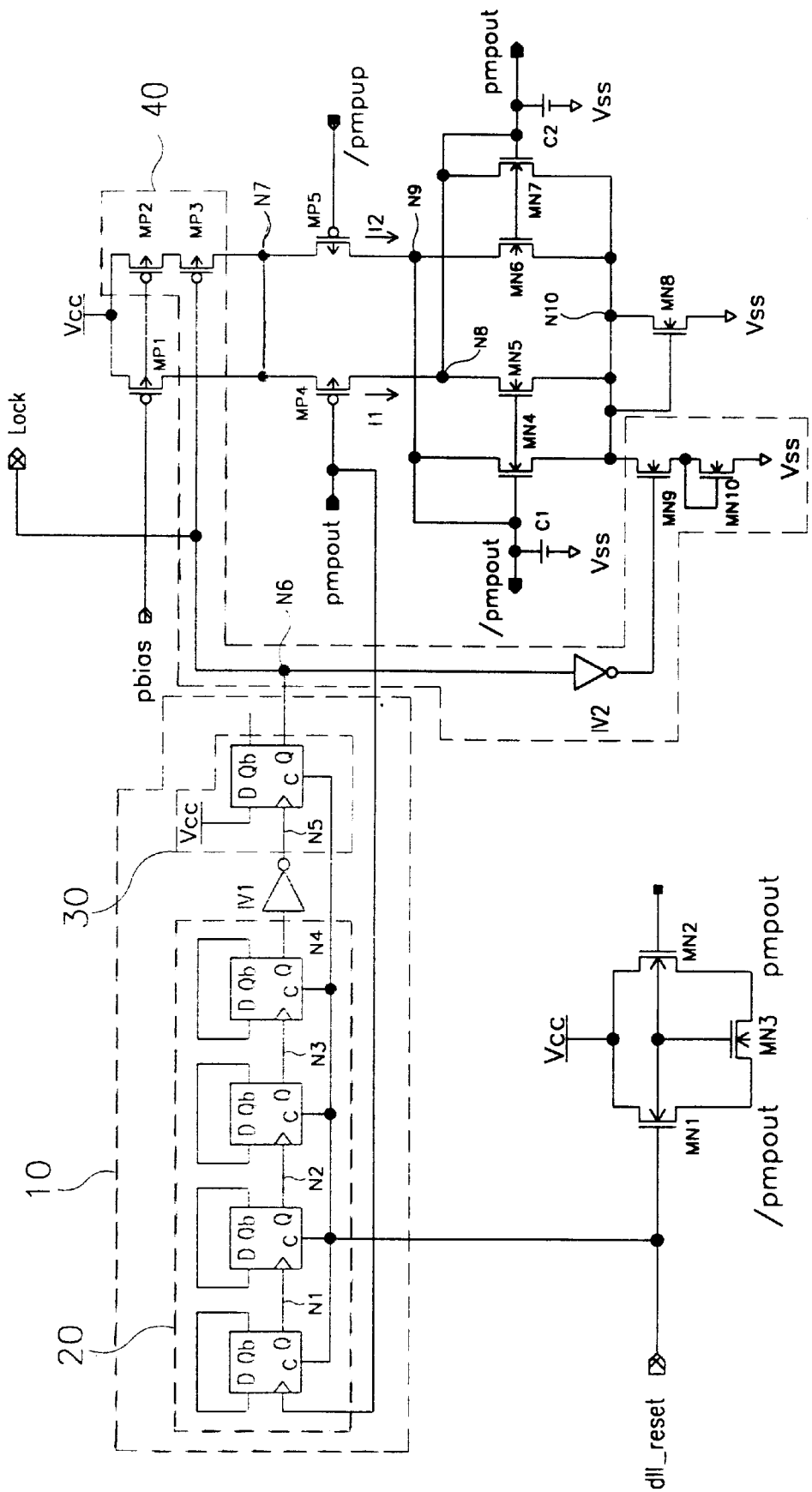
FIG. 2 is a circuit diagram illustrating a charge pump circuit in a DLL device according to the embodiment of the present invention.

FIG. 2 is a circuit diagram illustrating a charge pump circuit in a DLL device according to the embodiment of the present invention.

As shown in FIG. 2, the charge pump circuit includes a lock time/jitter controller 40, a lock time/jitter driver 10, and a charge pump reset portion. The lock time/jitter controller 40 includes a first PMOS transistor MP1 connected between a power source voltage terminal Vcc and a seventh node N7, whose gate receives a certain bias voltage pbias; a fourth PMOS transistor MP4 connected between the seventh node N7 and an eighth node N8, whose gate receives a phase detector output signal pmpup; a fifth PMOS transistor MP5 connected between the seventh node N7 and a ninth node N9, whose gate receives a phase detector output signal /pmpup; a fourth NMOS diode MN4 connected between the ninth node N9 and a tenth node N10, whose gate is connected to a pump output terminal /pmpout; a fifth NMOS transistor MN5 connected between the eighth node N8 and the tenth node N10, whose gate is connected to the pump output terminal /pmpout; a first capacitor C1 connected between the pump output terminal /pmpout and a ground voltage terminal Vss; a seventh NMOS diode MN7 connected between the eighth node N8 and the tenth node N10, whose gate is connected to the pump output terminal pmpout; a sixth NMOS transistor MN6 connected between the ninth node N9 and the tenth node N10, whose gate is connected to the pump output terminal pmpout; a second capacitor C2 connected between the pump output terminal pmpout and the ground voltage terminal Vss; an eighth NMOS transistor MN8 connected between the tenth node N10 and the ground voltage terminal Vss; second and third PMOS transistors MP2 and MP3 connected between the power source voltage terminal and the seventh node N7 in series, whose gates respectively receive the certain bias voltage pbias and a voltage on the sixth node N6; and a ninth NMOS transistor MN9 and a tenth NMOS diode MN10 connected between the tenth node N10 and the ground voltage terminal in series, whose gates receive an inverted voltage of the voltage on the sixth node N6. The lock time/jitter driver 10 outputs a driving signal for driving the lock time/jitter controller 40 to the sixth node N6 by receiving a charge pump reset signal dll-reset and a phase detector output signal. The charge pump reset portion is operated by the charge pump reset signal and initiates the potential of the pump output terminal at the original level.

The lock time/jitter driver 10 is likely to generate an unstable phase detector output signal because the movement of inner clock is great due to large variation of the potential of the pump output terminal. Accordingly, to solve this problem, the lock time/jitter driver 10 includes a counter 20 consisting of four D flip-flops which respectively receive the charge pump reset signal in order to identify whether stable lock is achieved, and perform counting operation by receiving the phase detector output signal through a first D flip-flop, a first inverter IV1 for inverting an output signal of the counter 20, and a lock time/jitter control signal generator 30 for generating a lock time/jitter control signal to the sixth node by receiving the output signal of the first inverter IV1 and the power source voltage.

The lock time/jitter control signal generator 30 includes a D flip-flop.

The charge pump reset portion includes a first NMOS transistor MN1 connected between the power source voltage terminal and the pump output terminal /pmpout, whose gate receives the charge pump reset signal; a second NMOS transistor MN2 connected between the power source voltage terminal and the pump output terminal pmpout, whose gate receives the charge pump reset signal; and a third NMOS transistor MN3 connected between the two pump output terminals /pmpout and pmpout, whose gate receives the charge pump reset signal.

A lock signal which is indicative of the LOCK is generated in the sixth node.

Figure 3:
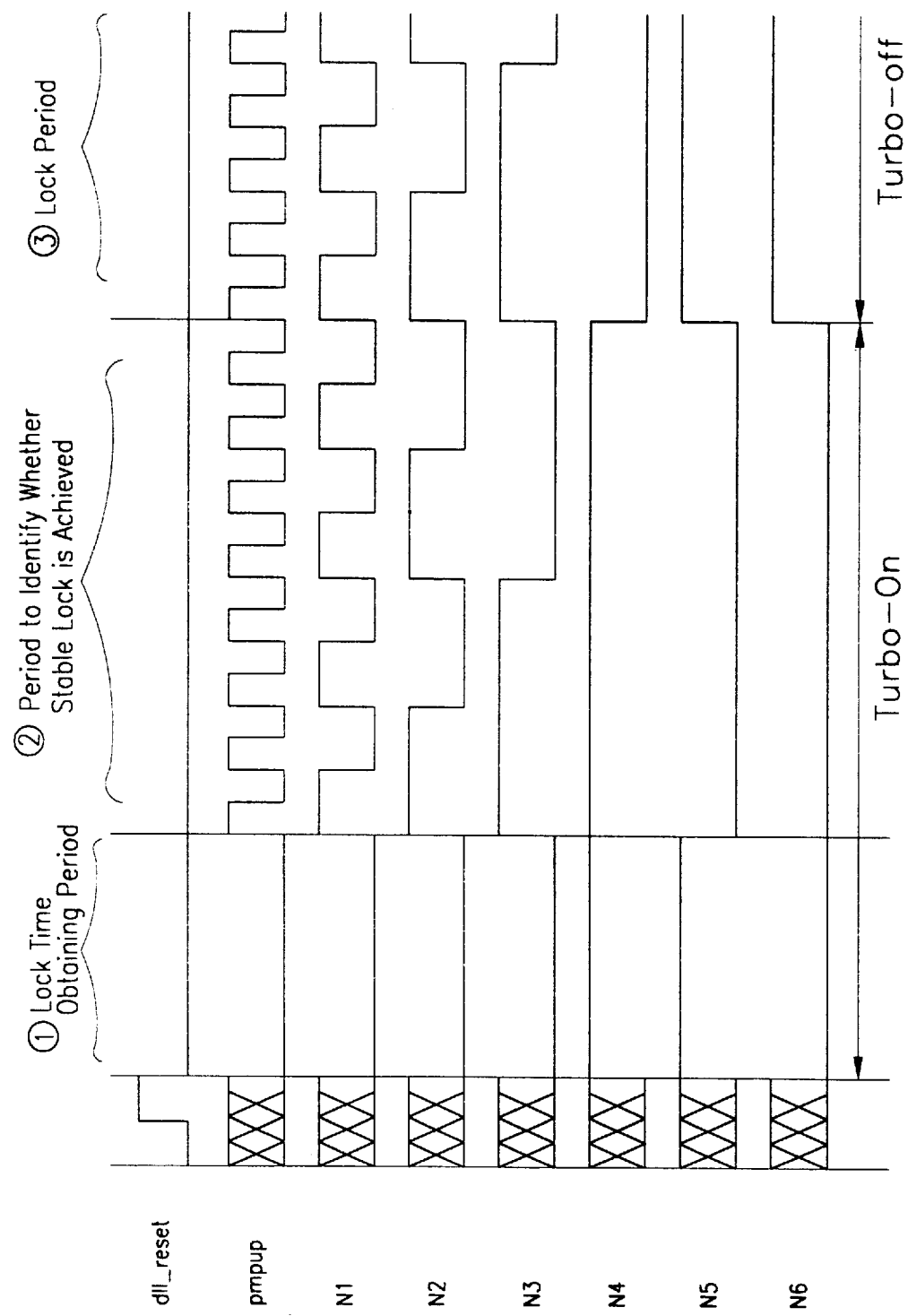
FIG. 3 is a timing chart illustrating the operation of a lock time/jitter driving circuit of FIG. 2.

The operation of the aforementioned charge pump circuit according to the present invention will be described with reference to an operation timing chart of FIG. 3.

The potential of the two pump output terminals becomes high by the first charge pump reset signal.

In this state, current $I_1$ and current $I_2$ are determined depending on the output signals pmpup and /pmpup of the phase detector. These currents determine charge/discharge of the first and second capacitors connected to the pump output terminal.

In other words, the first and second PMOS transistors are turned on by the certain bias voltage. And, at the state that the third PMOS transistor MP3 is turned off by low voltage on the sixth node, if the pmpup signal is low and /pmpup signal is high, the fourth PMOS transistor MP4 is turned on while the fifth PMOS transistor MP5 is turned off so that the current $I_1$ flows. Therefore, the second capacitor is charged and the charge charged in the first capacitor is discharged to the ground voltage terminal through the sixth NMOS transistor MN6.

As a result, the potential of the pump output terminal pmpout ascends and the DLL device adjusts the delay.

Meanwhile, if the phase detector output signal pmpup is high, pumping direction is changed, so that the potential of the pump output terminal pmpout descends while the potential of the pump output terminal /pmpout ascends. This is caused by inverting the pmpup signal by the phase detector in the DLL device if the inner clock is faster than the outer clock as the pmpout potential gradually ascends. In other words, pumping direction of the pump is changed so as to allow the phase of the inner clock to be faster than the phase of the outer clock.

If the phase of the inner clock is again slower than the phase of the outer clock, pumping direction of the pump is again changed. This operation continues to repeat. Finally, lock state is achieved. The size of the currents $I_1$ and $I_2$ is proportional to pumping speed, i.e., time variation of the potential of the pump output terminal.

Therefore, the potential on the sixth node becomes high until lock state, so that the third PMOS transistor MP3 and the ninth NMOS transistor MN9 of the lock time/jitter controller are turned on. Thus, the size of the current $I_1$ or the current $I_2$ becomes great to follow the outer clock at high speed. This reduces a lock time obtaining period as shown in FIG. 3.

Meanwhile, movement of the inner clock becomes great by large variation of the potential of the pump output terminal. For this reason, it is likely that the unstable phase detector output signal can be generated. To prevent the unstable phase detector output signal from being generated, the counter receives the phase detector output signal received to the charge pump circuit and identifies whether or not stable lock is achieved as shown in FIG. 3.

The size of the counter is determined to be proportional to the size of the current $I_1$ or the current $I_2$ which flows when the lock time/jitter controller is operating.

Subsequently, if stable lock is achieved by completing counting, the potential on the sixth node which is the output terminal of the lock time/jitter driver is set to high, so that the third PMOS transistor MP3 and the ninth NMOS transistor MN9 of the lock time/jitter controller are turned off.

As a result, current value is reduced after lock so that the size of the output jitter, i.e., movement of the inner clock is reduced. This allows the DLL of excellent performance to be designed. In addition, since a lock signal which is indicative of LOCK is generated, there is no inconvenience in interfacing with external environment.

As aforementioned, the charge pump circuit according to the present invention has the following effects.

Since current value increases until lock to reduce lock time and current value is reduced after lock by adding a simple circuit to the existing charge pump circuit, the size of the output jitter can be reduced, thereby improving performance of the DLL device. In addition, since the lock signal which is indicative of lock is generated, interface with the external environment can easily be performed and unnecessary standby time can be reduced so that the device with excellent performance can be designed.

It will be apparent to those skilled in the art that various modifications and variations can be made in the charge pump circuit according to the present invention without departing from the spirit or scope of the invention. Thus, it is intended that the present invention covers the modifications and variations of the invention provided they come within the scope of the appended claims and their equivalents.

What is claimed is:

1. A charge pump circuit for obtaining a short lock time and a low jitter comprising:

a lock time/jitter control means, connected to a power source supply terminal and a ground terminal of the charge pump circuit, for controlling current value; and a lock time/jitter driving means for outputting a driving signal of the lock time/jitter control means, wherein the lock time/jitter driving means includes:

a counter for receiving a phase detector output signal and a charge pump reset signal to prevent the phase detector output signal from becoming unstable; and a lock time/jitter control signal generating means for outputting a control signal of the lock time/jitter control means from an output of the counter and a power source voltage.

2. The charge pump circuit as claimed in claim 1, wherein the counter includes a plurality of D flip-flops.

3. The charge pump circuit as claimed in claim 1, wherein the lock time/jitter control signal generating means includes a D flip-flop.

* * * * *